United States Patent [19]
Davis et al.

[11] Patent Number: 4,867,371
[45] Date of Patent: Sep. 19, 1989

[54] FABRICATION OF OPTICAL DEVICES

[75] Inventors: Richard Davis, Bugbrooke; Robert C. Goodfellow, Brackley; Peter J. Morgan, Blisworth, all of England

[73] Assignee: Plessey Overseas Limited, Ilford, England

[21] Appl. No.: 70,150

[22] Filed: Jul. 2, 1987

Related U.S. Application Data

[63] Continuation of Ser. No. 720,715, Apr. 8, 1985, abandoned.

[30] Foreign Application Priority Data

Apr. 6, 1984 [GB] United Kingdom ................. 8408877

[51] Int. Cl.$^4$ ............................................. B23K 31/02
[52] U.S. Cl. .................................... 228/160; 228/176; 228/188; 65/30.13; 65/37; 65/38; 65/42; 65/56
[58] Field of Search ..................... 65/30.13, 31, 36–38, 65/42, 56, 155, DIG. 11; 156/99; 228/188, 160, 176, 155; 29/411, 840, 832

[56] References Cited

U.S. PATENT DOCUMENTS

| | | | |
|---|---|---|---|
| 3,086,281 | 4/1963 | Shockley | 29/411 |
| 3,380,155 | 4/1968 | Burks | 228/188 |
| 3,470,611 | 10/1969 | McIver | 228/188 |
| 3,486,223 | 12/1969 | Butera | 228/188 |
| 3,968,564 | 7/1976 | Springthorpe | 29/580 |
| 4,031,423 | 6/1977 | Siegmund | 65/37 |
| 4,045,200 | 8/1977 | Salisbury | 65/42 |
| 4,067,104 | 1/1978 | Tracy | 228/188 |
| 4,345,833 | 8/1982 | Siegmund | 264/1.5 |
| 4,414,009 | 11/1983 | Siegmund | 65/38 |
| 4,509,824 | 4/1985 | Yamasaki et al. | 427/163 |
| 4,572,611 | 2/1986 | Bellman et al. | 65/33 |

OTHER PUBLICATIONS

Oikawa et al., 8030 Electronics Letters, Optical Tap Array Using Distributed-Index Planar Microlens, vol. 18, No. 8, London 1982.

Primary Examiner—Kenneth M. Schor
Attorney, Agent, or Firm—Fleit, Jacobson, Cohn, Price, Holman & Stern

[57] ABSTRACT

A relatively large scale low cost method of fabricating optical devices with associated coupling lenses comprises the following steps:
(a) producing in one surface of a substrate (1) of suitable material(s) a predetermined array of planar diffused lenses (4);
(b) forming or otherwise producing on the opposite surface of the substrate (1) remote from the planar lenses (4) but in predetermined positional relationship to the lenses in the general planar direction of the substrate an array or pattern of metallic bonding pads or other registration means co-operable with corresponding pads or other means provided on a multiplicity of optical devices (10) for the accurate registration of such devices relative to the optical lenses; and,
(c) dividing the substrate (1) into a multiplicity of parts each of which comprises an optical device (10) having an associated planar lens (4).

4 Claims, 6 Drawing Sheets

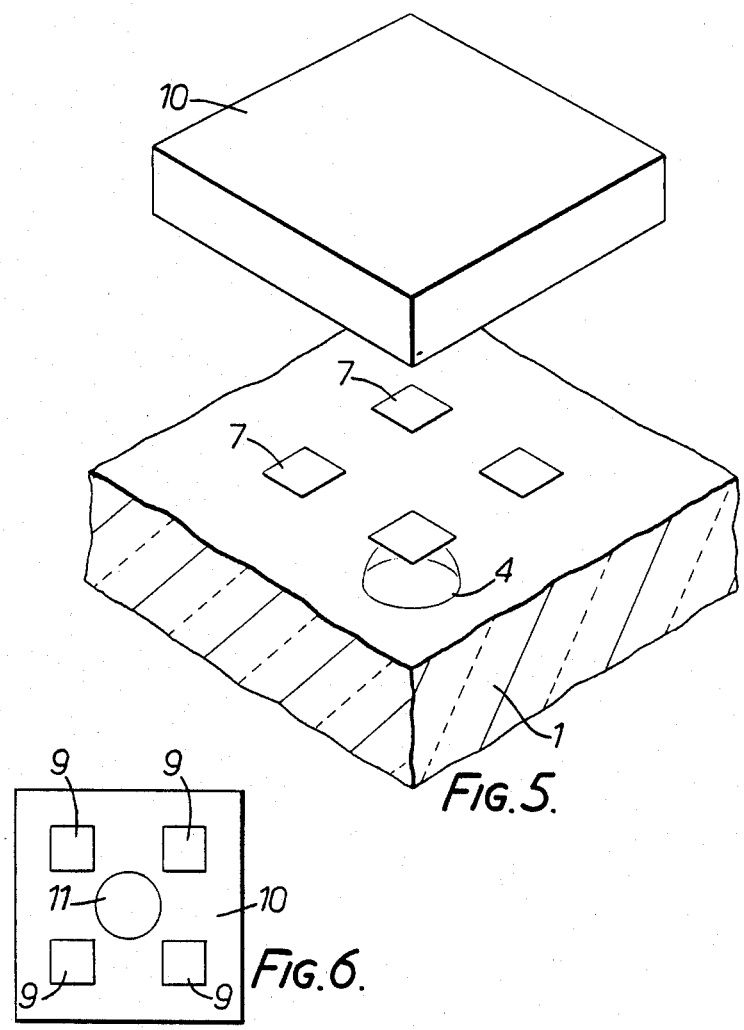
FIG.5.
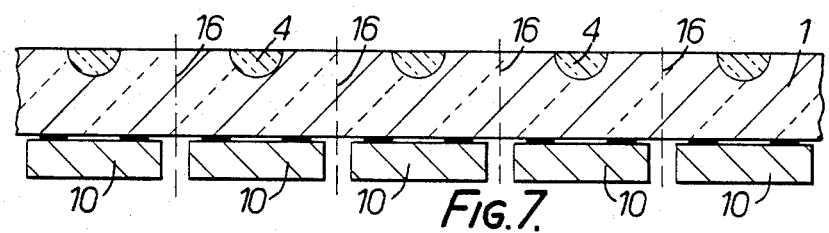
FIG.6.
FIG.7.

FABRICATION OF OPTICAL DEVICES

This application is a continuation of application Ser. No. 720,715, filed Apr. 8, 1985, now abandoned.

BACKGROUND OF THE INVENTION

Field of the Invention

This invention relates to the fabrication of optical devices, such as light-emitting diodes, photodiodes and photo-transistors, having associated lenses for optically coupling such devices to external optical means (e.g. optical fibres).

BRIEF SUMMARY OF THE INVENTION

The present invention is directed to a relatively large scale low cost method of fabricating optical devices with associated coupling lenses, said method comprising the steps of producing in one surface of a substrate of suitable material(s) a predetermined array of planar diffused lenses and forming or otherwise producing on the opposite surface of the substrate remote from said planar lenses but in predetermined positional relationship to said lenses in the general planar direction of the substrate an array or pattern of metallic bonding pads or other registration means co-operable with corresponding pads or other means provided on a multiplicity of optical devices for the accurate registration of such devices relative to the optical lenses, following which the substrate may be divided into a multiplicity of parts each of which comprises at least one optical device having an associated planar lens.

For the purpose of bonding the optical devices to the substrate the metallic bonding pads on the substrate and the optical devices may be coated with solder and solder reflow/positioning techniques are then employed to actually effect the bonding of the devices to the substrate.

Before dividing the lens substrate, additional electronic components (e.g. field-effect transistors, integrated circuits and passive resistors and capacitors) may be bonded to a suitable interconnection pattern formed, as by thick or thin-film techniques, on the surface of the substrate remote from the planar lenses. Such electronic components may be appropriately packaged, encapsulated or otherwise suitably enclosed. After dividing up (e.g. sawing) the substrate assembly into individual opto-electronic devices the latter may be electrically connected to the leads of appertaining lead frames prior to final encapsulation by a plastics moulding technique with the lead wires extending from the encapsulated devices and the moulding process leaving a port through the moulding in order to provide optical access to and from the planar lens contained within the encapsulated device.

The array of planar lenses may be produced by known techniques (i.e. dopant diffusion techniques) in one surface of a glass sheet which constitutes the assembly substrate. The size and positions of the diffused lenses may be accurately predetermined by first coating the glass sheet with a material (e.g. metal) which can be etched away to leave openings which faciltate the diffusion of dopants into the glass in order to produce the array of planar lenses having the requisite optical characteristics.

The other surface of the glass sheet may also be coated with metal which by the use of photolithographic methods can be etched away to leave inter alia an array or pattern of metal pads which may be used for achieving registration and bonding of optical devices to the glass substrate in accurate positional relationship with their appertaining lenses. For such bonding the metal pads may be coated with solder and bonded to corresponding solder-coated metal pads provided on the optical devices by using solder reflow/positioning techniques. Registration of the optical devices relative to the optical axes of the appertaining lenses can thus be achieved.

In cases where thick films are required to be printed on the substrate for component interconnection purposes it may be necessary, in view of the high firing temperatures of thick-film materials to be used, for the thick-film circuit pattern to be printed on a sheet of silica which can then be bonded to a sheet of glass in which the diffused planar lenses are produced. The glass sheet may be formed on the side thereof remote from the planar lenses with marks which can be aligned with marks on the silica sheet prior to bonding together the two sheets and thereby ensure correct registration of metal bonding pads or the equivalent (e.g. thick film pattern) on the silica sheet for receiving the optical devices relative to the planar lenses.

BRIEF DESCRIPTION OF THE DRAWINGS

By way of example the present invention will now be described with reference to the accompanying drawings in which:

FIG. 5 shows an optical device located above a fragment of the substrate of FIGS. 3 and 1 in readiness for bonding thereto;

FIG. 6 shows the underside of the optical device shown in FIG. 5;

FIG. 7 shows a fragmentary cross-sectional view through the planar lens substrate of FIG. 5 having a plurality of optical devices bonded thereto;

DETAILED DESCRIPTION OF THE PREFERRED EMBODIMENT

Figure 1:
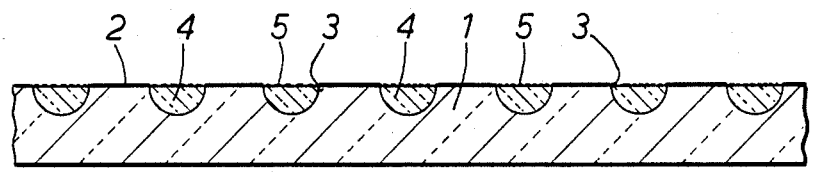
FIGS. 1 and 2 are fragmentary cross-sectional and plan views of a planar diffused lens array produced on a glass substrate.
Figure 2:
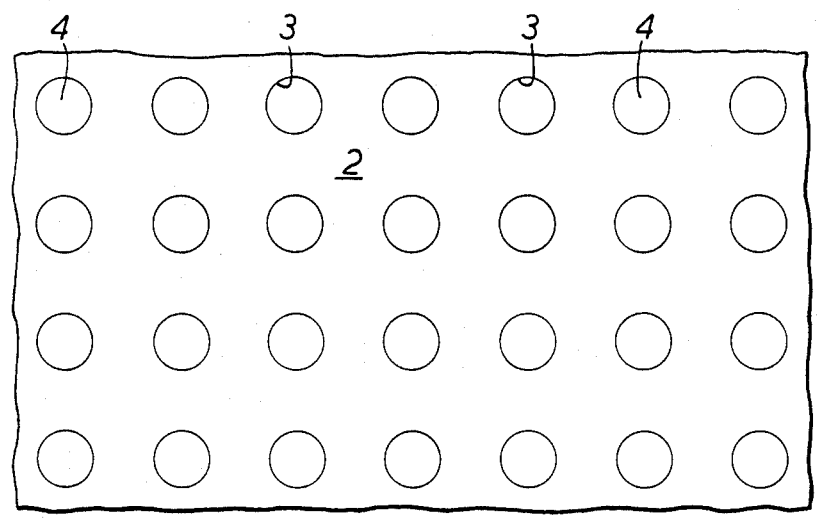

The array of planar lenses shown in FIGS. 1 and 2 may be produced by coating a sheet of glass 1 (e.g. soda-lime or borosilicate) of suitable size and thickness with a coating 2 of metal or other suitable material on its upper surface as viewed in FIG. 1 and then etching away circular areas 3 of the coating material in order to expose the upper glass surface in those locations where planar lenses are to be formed. By means of a known diffusion process, suitable dopants are diffused into the glass, through the circular openings 3 in the coating on the glass, so that an array of planar lenses 4 of generally hemispherical configuration are formed in the surface of the sheet of glass. An anti-reflection/protective coating 5 (FIG. 1) may then be selectively deposited over the planar lenses 4.

Figure 3:
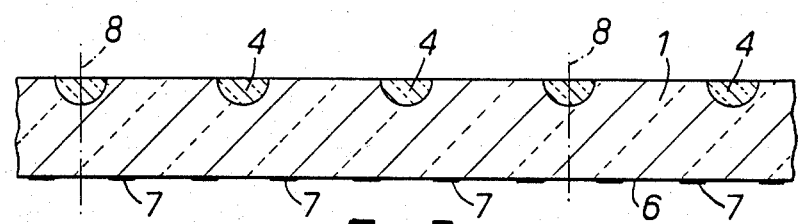
FIGS. 3 and 4 are fragmentary cross-sectional and plan views of the glass substrate of FIGS. 1 and 2 provided with an array of metallic bonding pads.
Figure 4:
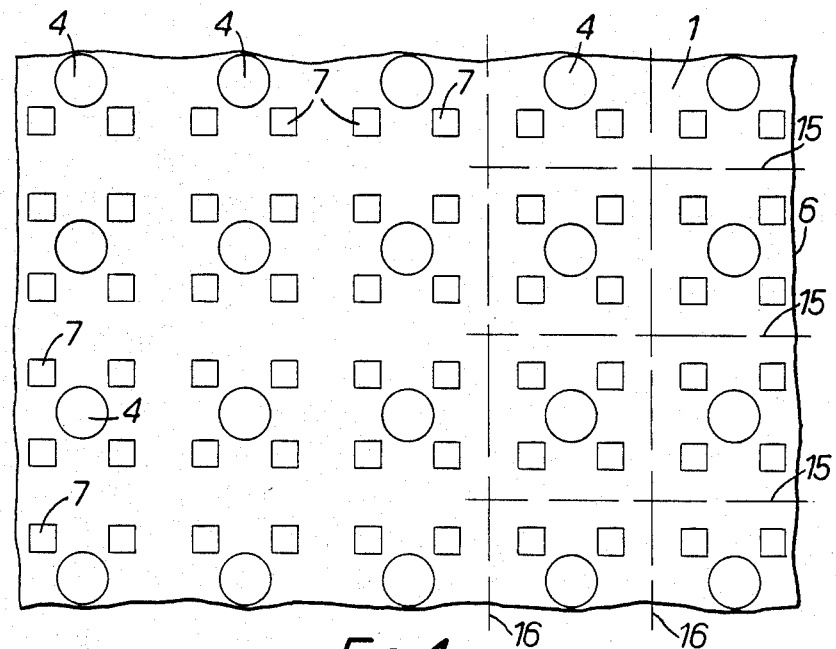

As has been explained previously, the planar lenses 4 which form an integral part of the lens substrate 6 are intended to be used in association with individual optical devices (e.g. light-emitting diodes, photodiodes, phototransistors etc) and for the purpose of bonding such optical devices to the underside of the lens substrate 6, a pattern or array of metallic bonding pads are formed on the underside of the substrate as can be seen in FIGS. 3 and 4. These bonding pads shown at 7 in FIGS. 3 and 4 may be formed by coating the underside of the glass sheet 1 with metal (preferably at the same time as coating the upper surface of the glass sheet with metal prior to diffusion of the planar lenses) and thereafter by use of a photo lithographic process etching away the metal to leave the pattern of metal pads as shown, which are accurately positioned in predetermined relationship with the optical axes of the planar lenses as indicated at 8 in FIG. 3, in order to ensure that subsequent positioning of the bonded optical devices by means of these pads correctly locates the optically responsive or generative parts of the devices relative to the optical axes of their appertaining lenses 4.

The metal pads 7 are then coated with a suitable solder (e.g. lead-tin, lead-indium or gold-tin etc) by selective deposition or by applying an overall layer of solder and then selectively etching away the solder between the metal pads.

The deposition of solder may be accomplished by the use of sputtering, evaporation or electro-plating techniques. Groups of solder-coated bonding pads positioned around a planar lens, such as the metal pads 7 in FIG. 5, may then be aligned with correspondingly positioned solder coated bonding pads 9 (see FIG. 6) provided on the underside of an optical device 10 and the device 10 bonded to the lens substrate 6 by producing reflow of the solder deposited on the bonding pads. As can be seen from FIG. 6, the optical device 10 includes a circular, optically responsive or generative surface 11 which needs to be centralised with respect to the optical axis of the planar lens 4. It may here be mentioned that as the optical device 10 and the substrate 6 are brought together for bonding purposes, a degree of misalignment between them can be tolerated since the surface tension effects in the solder during the solder reflow process will pull the optical device 10 into its correct position relative to the optical axis of the lens.

Figure 8:
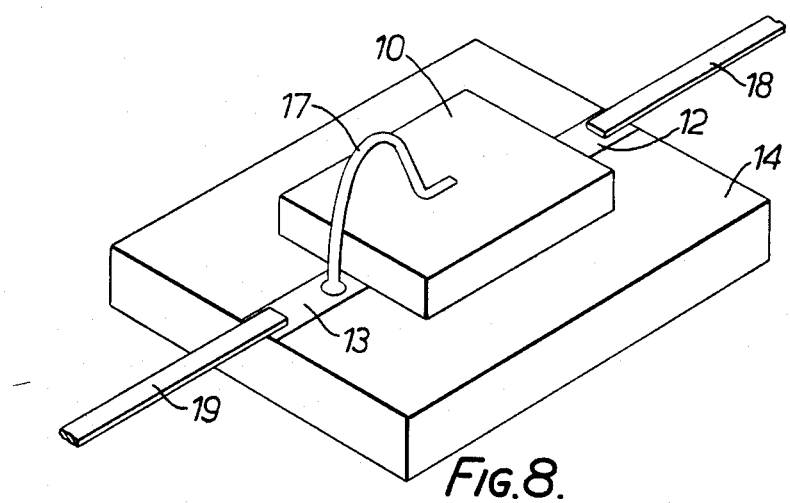
FIG. 8 shows a single optical device mechanically bonded and electrically connected to its associated individual planar lens substrate unit.

FIG. 7 of the drawings shows a number of optical devices 10 bonded to the underside of the lens substrate 6. The electrical connections between the optical device and the substrate may be made through the bonding pads and further metallised areas which may have been formed during the pad etching process referred to earlier. One such electrical connection arrangement is depicted in FIG. 8 which shows the metallised areas 12 and 13 on the underside of a lens substrate unit 14 which comprises one of a multiplicity of similar substrate units produced by dividing (e.g. sawing) the lens substrate 6 along the lines 15 and 16 indicated in FIGS. 4 and 7. In this particular FIG. 8 arrangement, the metallised area 13 is connected to the base contact of the optical device 10 by means of a wire bond 17 whilst the other contact of the device 10 will be connected via one of the bonding pads (not shown) to the metallised area 12. Terminals 18 and 19 are then bonded to the metallised areas 12 and 13 respectively.

Figure 9:
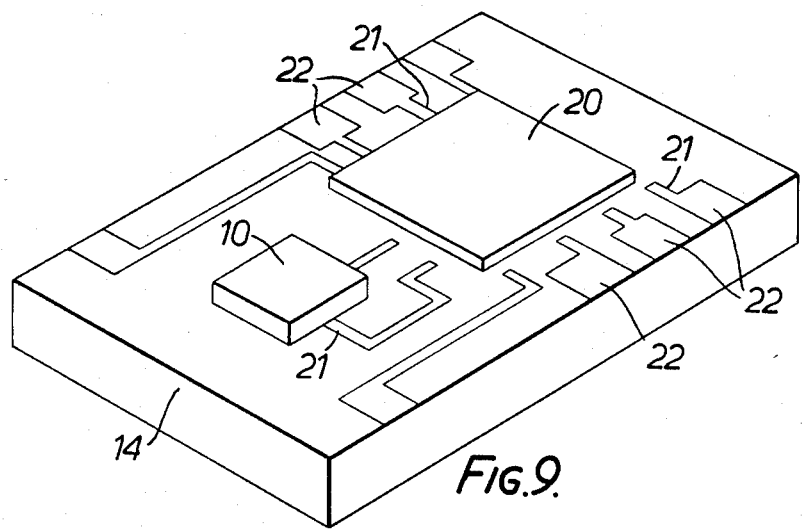
FIG. 9 shows a single optical device mechanically bonded and electrically connected to its associated individual planar lens substrate unit, together with an integrated circuit package or bare chip (I.C.)
Figure 10:
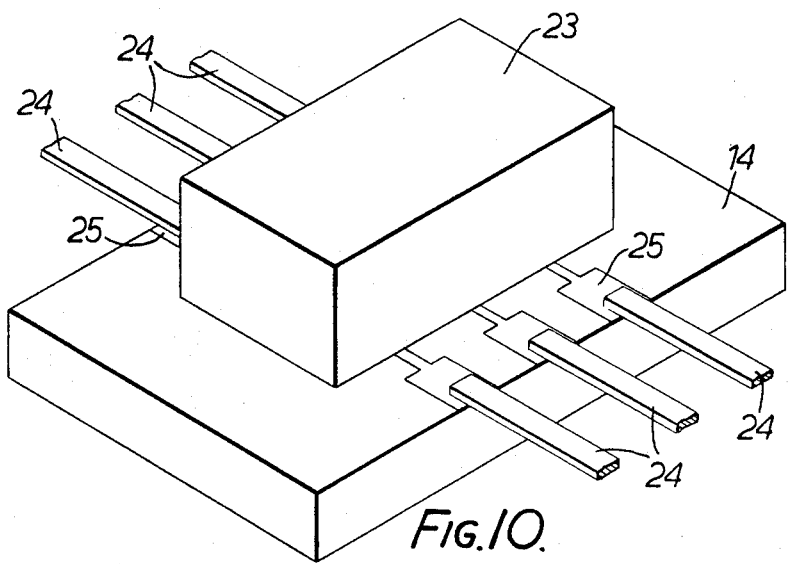
FIG. 10 shows one form of encapsulated optical device bonded to a planar lens substrate unit and including electric terminal means.

FIG. 9 shows a modified arrangement in which an optical device 10 is bonded to a planar lens subtrate unit 14 in the manner already described, but in addition to the optical unit, the substrate unit carries other components, such as an integrated circuit package 20 which may be in silicon or gallium arsenide or transistors (e.g. FET) and passive components which may be electrically interconnected with each other by means of thick or thin film circuitry 21 formed on the substrate unit 14. The integrated circuit package 20 which may be packaged in a chip carrier to provide a pre-tested hermetically sealed device may be solder bonded to the substrate unit 14. A bare chip may be bonded by well-known flip-chip bonding techniques or by attaching to diffused lens substrate and interconnecting by wire bonding. Terminal pins (not shown) may be bonded to the metallised areas (e.g. areas 22 extending to the edges of the substrate unit 14). The active components, such as the device 10 and the integrated circuit package 20 could be protected by coating them with suitable polymers. However, as an alternative arrangement the active components, including the optical device 10 and the integrated circuit 20 may be encapsulated by positioning a cover 23 of suitable insulating material over the components as shown in FIG. 10 and the cover may then be hermetically bonded to the substrate unit 14. This cover may be designed to provide EMI shielding of the components within the encapsulated structure. Connecting terminals 24 which may be provided by the leads of a lead frame (not shown) are bonded to the metallised areas 25.

Figure 11:
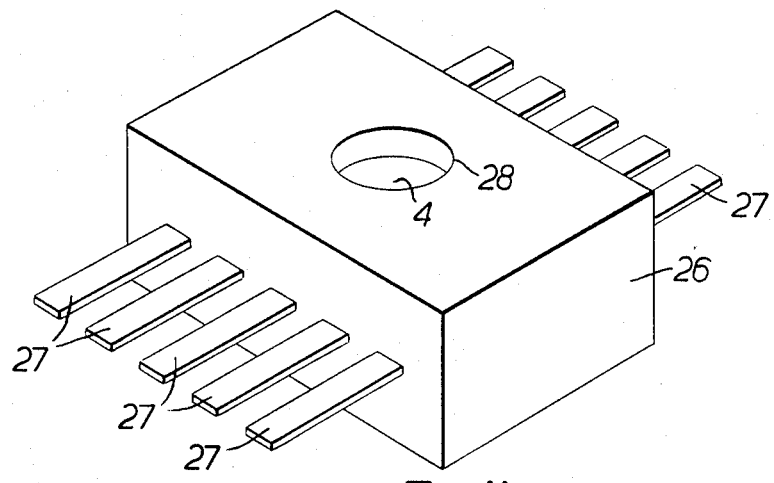
FIG. 11 shows an encapsulated form of the device shown in FIG. 9.

A further modification is shown in FIG. 11, in which the active components as well as the lens substrate unit are encapsulated within a plastics moulding 26 from which terminals 27 conveniently provided by the leads of a lead frame (not shown) extend and in which an optical port 28 is provided to afford optical access to the diffused lens 4 of the encapsuated substrate unit.

Figure 12:
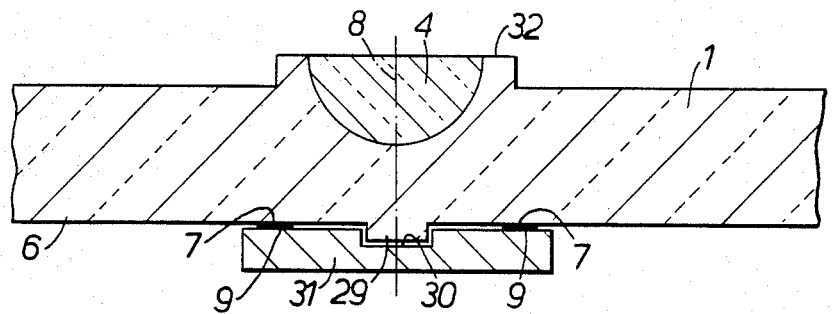
FIG. 12 is a fragmentary sectional view of an alternative arrangement for locating an optical device relative to its associated planar lens.

From a consideration of FIG. 12 of the drawings, it can be seen that the underside of the glass lens substrate 6 is provided with cylindrical protrusions, one of which is shown at 29 located co-axially in relation to the optical axes 8 of the planar lenses 4. These protrusions which may be produced by etching using lithographic techniques are arranged to register with cylindrical indentations, such as that shown at 30 in the optical device 31, in order to position the optical devices accurately with respect to the optical axes of the lenses 4. This technique may be used as an alternative, or, as an addition, to the solder reflow bonding-registration techniques referred to earlier.

Figure 13:
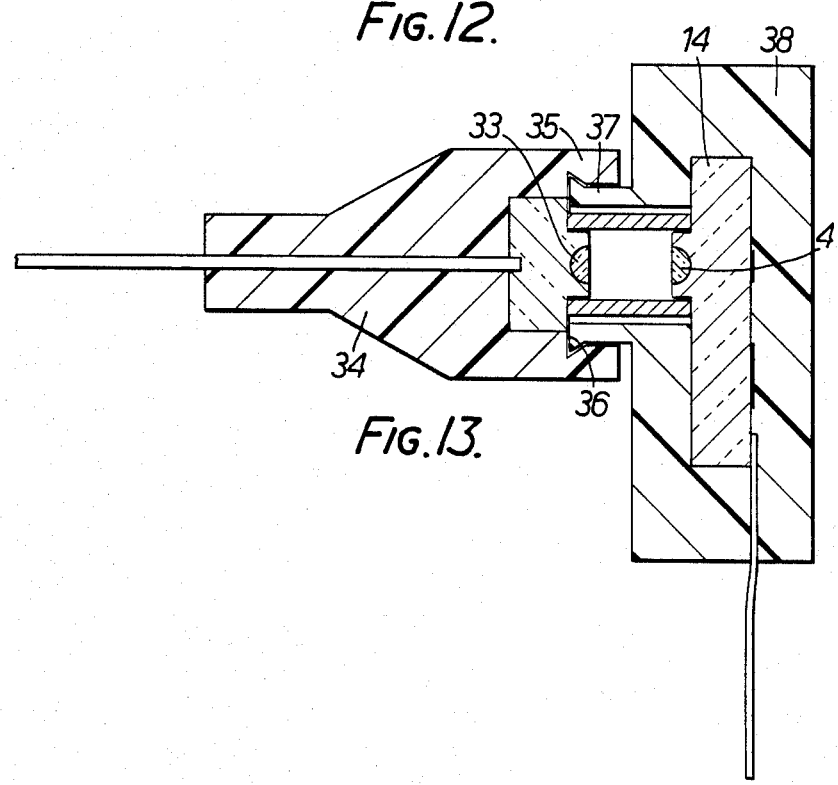
FIG. 13 is a cross-sectional view of an encapsulated optical device with associated planar lens and fabricated for coupling to an optical connector input/output means; and, FIG. 14 is a fragmentary cross-sectional view of a glass/silica composite lens substrate with printed thick-film circuitry thereon.

It will be observed that the upper face of the lens substrate 6 may also be etched away to provide cylindrical protrusions, one of which is shown at 32, concentric with the faces of the planar lenses 4. Such an arrangement may be utilised in the manner shown in FIG. 13 for the alignment of a planar lens 4 of an opto-electronic device with an integral planar lens 33 of an optical fibre connector 34. As shown, the connector part 34 may have a moulded head 35 with a cylindrical opening 36 for receiving a cylindrical extension 37 of the plastics moulding 38 encapsulating the lens substrate and optical device.

Figure 14:
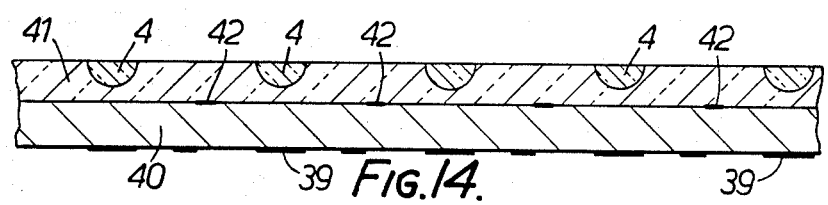

In some cases where it is required to provide thick-film circuitry on the lens substrate, the firing temperature required may be too high (e.g. 850° C.) to enable the printing of the circuitry to be effected on the glass sheet 1. Consequently, in such cases the thick-film circuitry 39 may be printed on a sheet of silica 40, as shown in FIG. 14 and the sheet bonded to a glass sheet 41 in which planar lenses 4 have been diffused. The bonding of the glass and silica sheets 40 and 41 together to form the lens substrate so that the two sheets are correctly positioned relatively to one another, may be achieved by aligning registration marks 42 on the respective sheet prior to bonding.

As will be appreciated from the foregoing description of a number of embodiments of the invention, the invention provides a relatively cheap and simple process for the large scale production of opto-electronic devices having integral planar lenses.

We claim:

1. A method of fabricating a multiple number of optical devices selected from the group consisting of light-emitting diodes, photodiodes and photo-transistors with associated coupling lenses comprising the steps of:
   producing a predetermined array of planar diffused lenses in a first surface of a substrate of suitable material;
   producing an array of solder-coated metallic bonding pads on a second surface of the substrate remote from said planar lenses but in accurate predetermined positional relationship to said lenses in the general planar direction of the substrate;
   providing a multiplicity of said optical devices, each of which has solder-coated metallic bonding pads on one surface thereof which are cooperable with the solder-coated metallic bonding pads of said array;
   attaching said substrate to said multiplicity of optical devices by positioning the solder-coated metallic bonding pads on the optical devices in contact with corresponding solder-coated metallic bonding pads on the substrate, heating the pads to cause solder re-flow so that the substrate and the optical devices automatically become accurately positioned relative to one another due to surface tension in the molten solder and then allowing the solder to harden; and,
   dividing said substrate to produce a multiple number of elements, each of which comprises at least one optical device having an associated planar lens.

2. The method of claim 1, comprising the steps of forming a suitable metallic interconnection pattern on the second surface of the substrate and bonding an integrated circuit package to said suitable metallic interconnection pattern before dividing the substrate.

3. The method of claim 1 further comprising the steps of connecting the optical devices to lead wires of appertaining lead frames after dividing the substrate into multiple elements, and then encapsulating the elements with plastic material such that the lead wires extend from the encapsulated elements and a port is provided through each encapsulated element in order to provide optical access to and from the planar lens contained within the encapsulated element.

4. A method of fabricating a multiple number of optical devices selected from the group consisting of light-emitting diodes, photodiodes and photo-transistors with associated coupling lenses comprising the steps of:
   producing a predetermined array of planar diffused lenses in a first surface of a substrate, said substrate being a sheet of glass;
   forming marks on a second surface of said substrate after said array of diffused planar lenses has been produced;
   providing a silica sheet having solder-coated metal bonding pads and a metallic interconnection pattern comprising a thick-film circuit pattern on a first side thereof and having marks on a second, opposite side thereof;
   contacting the second surface of the substrate with the second side of the silica sheet and aligning the marks on the substrate with the marks on the silica sheet;
   bonding together said substrate and said silica sheet to ensure correct registration of solder-coated metal bonding pads on the silica sheet for receiving the optical devices relative to the planar lenses;
   providing a multiplicity of said optical devices, each of which has solder-coated metallic bonding pads on one surface thereof which are cooperable with the solder-coated metallic bonding pads of said silica sheet;
   attaching said substrate to said multiplicity of optical devices by positioning the solder-coated metallic bonding pads on the optical devices in contact with corresponding solder-coated metallic bonding pads on the silica sheet, heating the pads to cause solder re-flow so that the substrate and the optical devices automatically become accurately positioned relative to one another due to the surface tension in the molten solder and then allowing the solder to harden; and then
   dividing said substrate to produce a multiple number of elements, each of which comprises at least one optical device having an associated planar lens.

* * * * *